(12) United States Patent
Nishimura et al.

(10) Patent No.: US 8,961,805 B2
(45) Date of Patent: Feb. 24, 2015

(54) DRY ETCHING METHOD FOR METAL FILM

(71) Applicant: Tokyo Electron Limited, Tokyo (JP)

(72) Inventors: Eiichi Nishimura, Miyagi (JP); Takashi Sone, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/656,178

(22) Filed: Oct. 19, 2012

(65) Prior Publication Data

US 2013/0098868 A1    Apr. 25, 2013

Related U.S. Application Data

(60) Provisional application No. 61/557,465, filed on Nov. 9, 2011.

(30) Foreign Application Priority Data

Oct. 20, 2011    (JP) .................................. 2011-230764

(51) Int. Cl.
| | | |
|---|---|---|
| *B44C 1/22* | (2006.01) | |
| *C03C 15/00* | (2006.01) | |
| *C03C 25/68* | (2006.01) | |
| *G11B 5/851* | (2006.01) | |
| *C23F 4/00* | (2006.01) | |
| *H01L 43/12* | (2006.01) | |

(52) U.S. Cl.
CPC . *G11B 5/851* (2013.01); *C23F 4/00* (2013.01); *H01L 43/12* (2013.01)
USPC ................................ 216/67; 216/22; 438/710

(58) Field of Classification Search
CPC ....... H01L 21/31116; C23F 1/12; G11B 3/70; G11B 5/84; B82Y 10/00
USPC ........................................ 216/22, 67; 438/710
See application file for complete search history.

(56) References Cited

U.S. PATENT DOCUMENTS

| | | | |
|---|---|---|---|
| 2005/0016957 A1* | 1/2005 | Kodaira et al. ................. | 216/67 |
| 2008/0286883 A1* | 11/2008 | Shiraiwa et al. ................. | 438/3 |
| 2009/0314740 A1* | 12/2009 | Ikemoto et al. ................. | 216/22 |

FOREIGN PATENT DOCUMENTS

| | | |
|---|---|---|
| JP | 10-68094 A | 3/1998 |
| JP | 2005-314791 A | 11/2005 |
| JP | 2006-60172 A | 3/2006 |

OTHER PUBLICATIONS

"Dry Etching of High-K Materials" of Ono Koichi, et al; Journal of Plasma Fusion Research, vol. 85, No. 4 (2009), pp. 185-192, issued in Jan. 2009.

* cited by examiner

*Primary Examiner* — Allan Olsen
*Assistant Examiner* — Margaret D Klunk
(74) *Attorney, Agent, or Firm* — Rothwell, Figg, Ernst & Manbeck, P.C.

(57) ABSTRACT

A method for performing dry etching on a metal film containing Pt via a mask layer includes performing dry etching on the metal film by generating a plasma of an etching gas including a gaseous mixture of $H_2$ gas, $CO_2$ gas, methane gas and rare gas. With the dry etching method, it is possible to make a vertical sidewall of a hole or trench more vertical without using a halogen gas.

11 Claims, 4 Drawing Sheets

DRY ETCHING METHOD FOR METAL FILM

CROSS-REFERENCE TO RELATED APPLICATION

This application claims priority to Japanese Patent Application No. 2011-230764 filed on Oct. 20, 2011 and U.S. Provisional Application No. 61/557,465 filed on Nov. 9, 2011, the entire contents of which are incorporated herein by reference.

FIELD OF THE INVENTION

The present invention relates to a dry etching method for a metal film.

BACKGROUND OF THE INVENTION

A magnetic storage device that stores therein information by using magnetization reversal by a magnetic field of an electric current is manufactured by using a semiconductor wafer in which various layers are laminated and etched in desired patterns. One of the layers of the magnetic storage device is a Pt—Mn layer containing Pt as a magnetic material. However, Pt is known as a material that is hardly etched.

As for an etching method for the Pt—Mn layer, there is known, a method for physically etching the Pt—Mn layer by ion milling, e.g., by sputtering using Ar positive ions of high energy. However, in the etching method of ion milling, positive ions are incident on a mask layer and a Pt—Mn layer with high energy. Therefore, it is difficult to obtain selectivity between the mask layer and the Pt—Mn layer. Further, the pattern shape of the mask layer is collapsed at an initial stage, and thus, a hole or a trench obtained by etching has a tapered shape (see, e.g., "Dry etching of high-k materials" of Ono Koichi, Takahashi Kazuo, and Erikuchi Koji: Journal of Plasma Fusion Research, Vol. 85, No. 4 (2009), pp. 185-192, issued in January 2009)

Furthermore, there has been proposed a method for chemically etching the Pt—Mn layer by an etching gas containing a highly reduced halogen gas of high reducibility (see, e.g., Japanese Patent Application Publication No. 2006-60172). Moreover, there is suggested a method for performing dry etching on a Pt layer by using a gaseous mixture of a halogen gas and CO (see, e.g., Japanese Patent Application Publication No. H10-68094).

Since, however, the halogen gas generates strong acids, corrosion of components of an etching apparatus is accelerated. Further, it is difficult to obtain a vertical sidewall, and the hole or the trench becomes tapered in shape.

SUMMARY OF THE INVENTION

In view of the above, the present invention provides a dry etching method for a metal film capable of making a sidewall of a hole or trench more vertical without using a halogen gas.

In accordance with an embodiment of the present invention, there is provided a method for performing dry etching on a metal film containing Pt via a mask layer including: performing dry etching on the metal film by generating a plasma of an etching gas including a gaseous mixture of $H_2$ gas, $CO_2$ gas, methane gas and a rare gas.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Hereinafter, an embodiment of the present invention will be described with reference to the accompanying drawings.

Figure 1:
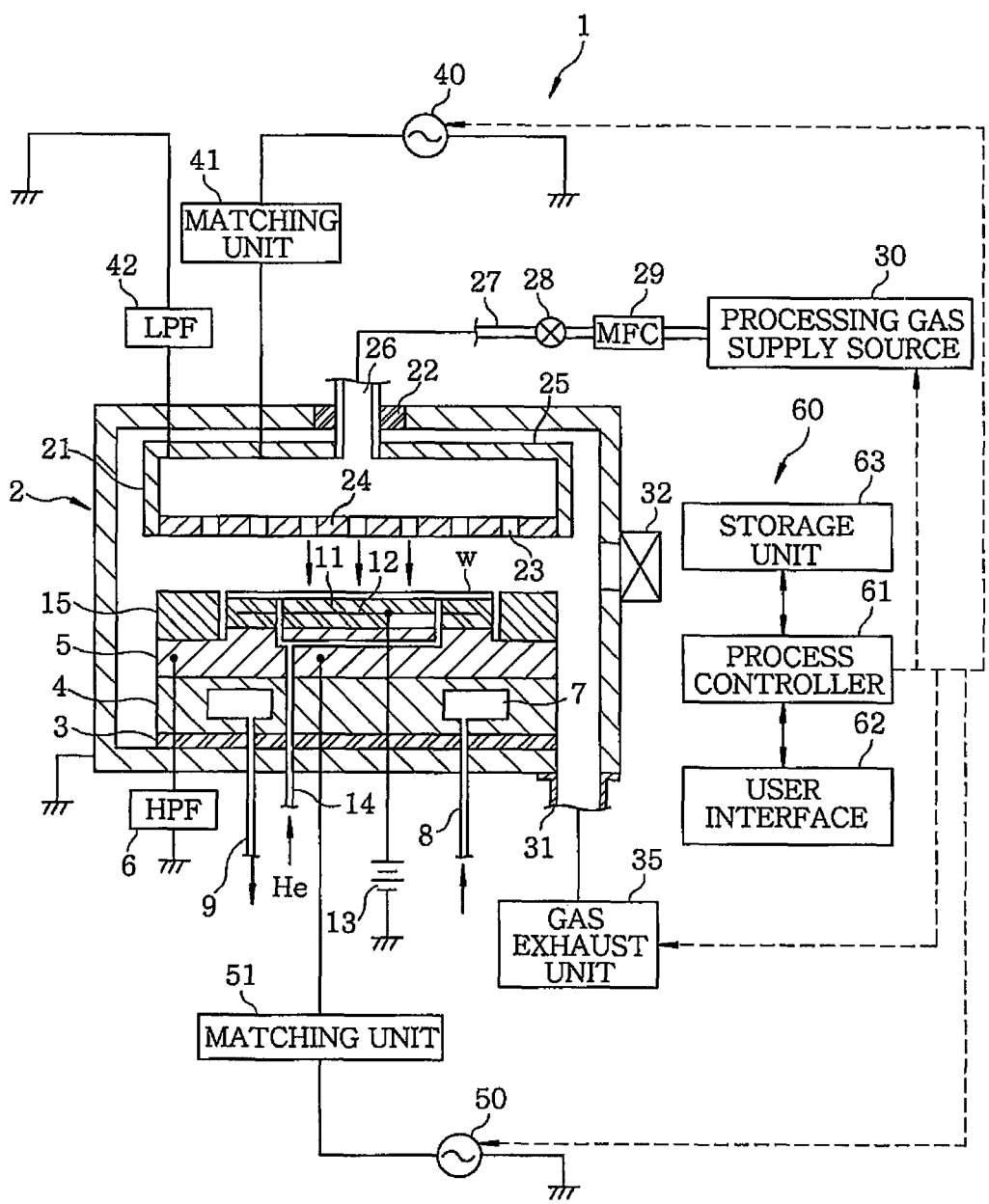
FIG. 1 schematically shows a configuration of a plasma etching apparatus in accordance with an embodiment of the present invention.

First, a configuration example of a plasma etching apparatus in accordance with an embodiment of a dry etching method for a metal film of the present invention will be explained. FIG. 1 schematically shows a cross section of a plasma etching apparatus used for dry etching of a metal film.

A plasma etching apparatus 1 includes a grounded cylindrical processing chamber 2 made of, e.g., aluminum having an anodically anodized surface. An approximately columnar susceptor support 4 for mounting thereon a target object, e.g., a semiconductor wafer W, is provided at a bottom portion of the processing chamber 2 via an insulating plate 3 such as ceramic or the like. Moreover, a susceptor (mounting table) 5, serving as a lower electrode, is provided above the susceptor support 4. The susceptor 5 is connected to a HPF (High Pass Filter) 6.

The susceptor support 4 has therein a temperature control medium path 7. A temperature control medium is introduced into the temperature control medium path 7 via an inlet line 8 to be circulated therethrough and is discharged via an outlet line 9. The heat of the temperature control medium is transferred to the semiconductor wafer W through the susceptor 5, and accordingly, the semiconductor wafer W is controlled to a required temperature.

The susceptor 5 has a disc-shaped top central portion which is protruded higher than its peripheral portion, and an electrostatic chuck 11, having substantially the same shape as that of the semiconductor wafer W is disposed on the top central portion of the susceptor 5. The electrostatic chuck 11 is formed by embedding an electrode 12 in an insulating material. Further, the semiconductor wafer W is electrostatically attracted to the electrostatic chuck 11 by, e.g., a Coulomb force generated by applying a DC voltage of, e.g., about 1.5 kV to the electrode 12 from a DC power supply 13 connected thereto.

In the insulating plate 3, the susceptor support 4, the susceptor 5 and the electrostatic chuck 11, there is formed a gas channel 14 for supplying a heat transfer medium (e.g., He gas or the like) to the backside of the semiconductor wafer W. The heat of the susceptor 5 is transferred to the semiconductor wafer W through the heat transfer medium, so that the semiconductor wafer W is maintained at a predetermined temperature level.

An annular focus ring 15 is disposed on a top peripheral portion of the susceptor 5 so as to surround the semiconductor wafer W mounted on the electrostatic chuck 11. The focus ring 15 is made of, e.g., a conductive material such as silicon or the like.

An upper electrode 21 is disposed above the susceptor 5 so as to face the susceptor 5 in parallel. The upper electrode 21 is held at a top portion of the processing chamber 2 via an insulating member 22. The upper electrode 21 includes an electrode plate 24 and an electrode holder 25 which is made of a conductive material and holds the electrode plate 24. The electrode plate 24 is made of a conductor or a semiconductor and has a plurality of injection openings 23. The electrode plate 24 is a surface facing the susceptor 5.

A gas inlet port 26 is provided at a center of the electrode holder 25 of the upper electrode 21, and a gas supply line 27 is connected to the gas inlet port 26. Further, the gas supply line 27 is connected, via a valve 28 and a mass flow controller (MFC) 29, to a processing gas supply source 30. The processing gas supply source 30 supplies a processing gas for plasma treatment.

A gas exhaust line 31 is connected to a bottom portion of the processing chamber 2, and a gas exhaust unit 35 is connected to the gas exhaust line 31. The gas exhaust unit 35 includes a vacuum pump, such as a turbo molecular pump or the like, to form a predetermined depressurized atmosphere in the processing chamber 2, i.e., to evacuate the processing chamber 2 to a specific vacuum level of, e.g., about 1 Pa or less. Further, a gate valve 32 is installed at a sidewall of the processing chamber 2. The semiconductor wafer W is transferred between the processing chamber 2 and an adjacent load-lock chamber (not shown) while the gate valve 32 is opened.

A first RF power supply 40 is connected to the upper electrode 21, and a matching unit 41 is disposed on a power supply line thereof. A LPF (Low Pass Filter) 42 is connected to the upper electrode 21. The first RF power supply 40 has a frequency ranging from about 13.56 MHz to 100 MHz. By applying the high frequency power in the above range, a high-density plasma in a desirable dissociated state can be generated in the processing chamber 2.

A second RF power supply 50 is connected to the susceptor 5 serving as the lower electrode, and a matching unit 51 is disposed on a power supply line thereof. The second RF power supply 50 has a frequency range lower than that of the first RF power supply 40. By applying a power of a frequency in such a range, a proper ionic action can be facilitated without inflicting damages on the semiconductor wafer W as a substrate to be processed. Preferably, the frequency of the second RF power supply 50 is within the range from about 1 MHz to 10 MHz.

The entire operation of the plasma etching apparatus 1 having the above-described configuration is controlled by a control unit 60. The control unit 60 includes a process controller 61 having a CPU for controlling individual components of the plasma etching apparatus 1; a user interface 62; and a storage unit 63.

The user interface 62 includes a keyboard for a process manager to input a command to operate the plasma etching apparatus 1, a display for visualizing an operational status of the plasma etching apparatus 1 and the like.

The storage unit 63 stores therein control programs (software) and recipes including processing condition data and the like to be used in carrying out various processes that are performed in the plasma etching apparatus 1 under the control of the process controller 61. When a command is received from the user interface 62, a necessary recipe is retrieved from the storage unit 63 and executed by the process controller 61. Accordingly, a desired process is carried out in the plasma etching apparatus 1 under the control of the process controller 61. The control programs or the recipes including the processing condition data may be retrieved from a computer-readable storage medium (e.g., a hard disk, a compact disk, a flexible disk, a semiconductor memory or the like), or may be transmitted on-line from another device via, e.g., a dedicated line, when necessary.

In case of performing plasma treatment on the semiconductor wafer W by using the plasma etching apparatus 1 having the above-described configuration, first, the gate valve 32 is opened and then, the semiconductor wafer W is loaded into the processing chamber 2 from a load-lock chamber (not shown) and mounted on the electrostatic chuck 11. Then, the semiconductor wafer W is electrostatically attracted to the electrostatic chuck 11 by applying a DC voltage from the DC power supply 13. Thereafter, the gate valve 32 is closed, and the processing chamber 2 is evacuated to a predetermined vacuum level by the gas exhaust unit 35.

Next, the valve 28 is opened, and a predetermined processing gas (e.g., a gaseous mixture of $H_2$ gas, $CO_2$ gas, methane gas and a rare gas) is introduced from the processing gas supply source 30 into the hollow space inside the upper electrode 21 via the gas supply line 27 and the gas inlet port 26 at a flow rate controlled by the mass flow controller 29. The processing gas is uniformly injected toward the semiconductor wafer W through the injection openings 23 formed in the electrode plate 24, as indicated by arrows in FIG. 1.

Then, the internal pressure of the processing chamber 2 is kept at a specific pressure level. Thereafter, a high frequency power of a predetermined frequency is applied from the first RF power supply 40 to the upper electrode 21. Hence, a high frequency electric field is generated between the upper electrode 21 and the susceptor 5 serving as the lower electrode, and the etching gas is converted into a plasma by dissociation. Moreover, a high frequency power of a predetermined frequency is applied from the second RF power supply 50 to the susceptor 5 serving as the lower electrode, if necessary. Accordingly, a proper ionic action can be applied to the semiconductor wafer W as a substrate to be processed.

Upon the completion of the predetermined plasma treatment, the supply of the high frequency powers and the processing gas is stopped, and the semiconductor wafer W is unloaded from the processing chamber 2 in a reverse sequence to that described above.

Figure 2A:
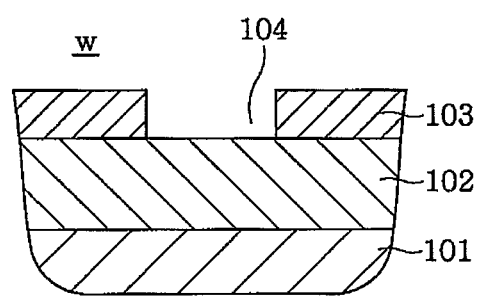
FIGS. 2A and 2B are diagrams for explaining a dry etching method for a metal film in accordance with the embodiment of the present invention.
Figure 2B:
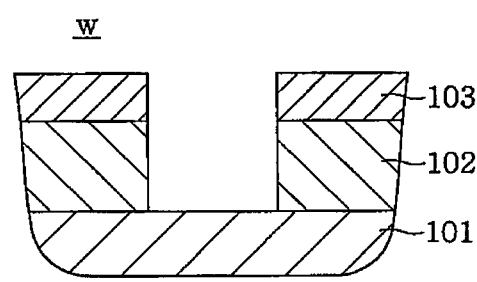

FIGS. 2A and 2B schematically show cross sectional configurations of principal parts of the semiconductor wafer W to explain a dry etching method for a metal film in accordance with an embodiment of the present invention. As shown in FIG. 2A, in accordance with the present embodiment, the semiconductor wafer W includes: a Pt—Mn layer 102 formed on a base portion 101 made of silicon; and a tantalum (Ta) layer 103 laminated on the Pt—Mn layer 102 and serving as a mask layer having a predetermined opening pattern 104.

The semiconductor wafer W having the above-described structure is loaded into the processing chamber 2 of the plasma etching apparatus 1 and mounted on the susceptor 5 so as to be subjected to plasma etching. In the present embodiment, the Pt—Mn layer (metal film containing Pt and Mn) 102 is etched by using the Ta layer 103 as a mask, as shown in FIG. 2B.

The plasma etching is performed by using an etching gas that is a gaseous mixture of $H_2$ gas, $CO_2$ gas, methane gas and a rare gas. The etching gas used in the present embodiment does not contain a halogen gas, so that the corrosion of the components of the plasma etching apparatus 1 can be suppressed. Further, a highly toxic gas such as a carbon monoxide gas or the like is not used and, thus, safety can be ensured.

The plasma etching is preferably performed in a predetermined depressurized atmosphere, e.g., about 6.65 Pa (50 mTorr) to 133 Pa (1 Torr). In other words, it is preferable to etch the Pt—Mn layer while maintaining the internal pressure of the processing chamber 2 at about 6.65 Pa (50 mTorr) or above to facilitate the generation of a carbonyl group, a carboxyl group and an organic complex. Generally, when the internal pressure of the processing chamber 2 reaches to a certain level, sputtering by positive ions is suppressed. Therefore, if the internal pressure of the processing chamber 2 is set to about 6.65 Pa (50 mTorr) or above, sputtering by positive ions in a plasma generated from hydrogen gas or argon gas can be suppressed. Accordingly, the chemical reaction, i.e., the generation of a carbonyl group, a carboxyl group and an organic complex, can be facilitated. In order to prevent collapse of the pattern shape of the Ta layer, it is preferable to suppress sputtering using positive ions and etching of the Ta layer by increasing the internal pressure of the processing chamber 2. Meanwhile, in view of facilitation of vaporization of an organic complex, it is preferable to reduce the internal pressure of the processing chamber 2 to a certain level, e.g., about 133 Pa (1 Torr) or less.

As a test example, the Pt—Mn layer 102, as a metal layer containing Pt and Mn, was subjected to plasma etching while using the Ta layer 103 as a mask under the following conditions.

Figure 3A:
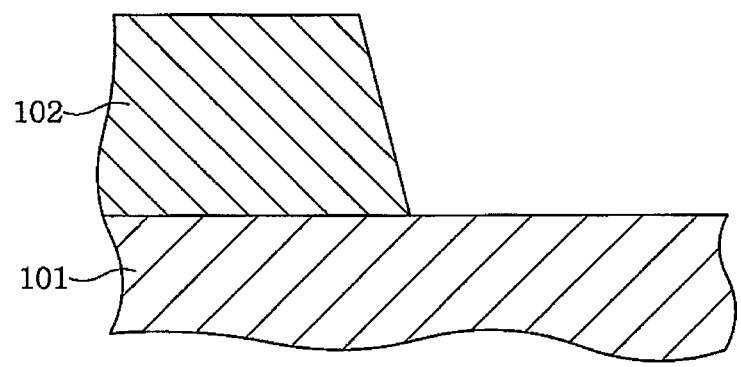
FIGS. 3A and 3B schematically show enlarged shapes of sidewalls in a test example and a comparative example.
Figure 3B:
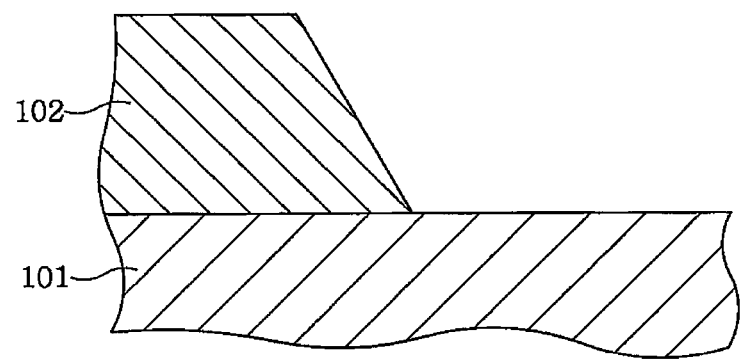

Etching gas: $H_2/CH_4/Ar/CO_2$=300/100/100/40 sccm
Pressure: 13.3 Pa (100 mTorr)
High frequency power of upper electrode: 200 W
High frequency power of lower electrode: 500 W
Backside Helium pressure (center/periphery): 1995/5320 Pa (15/40 Torr)
Temperature (top/sidewall/bottom): 90/60/60° C.
Time: 720 seconds As a result, as shown in FIG. 3A, the sidewall can be etched in an approximately vertical shape such that an angle between the sidewall and a horizontal plane (an included angle with respect to the horizontal plane) becomes about 85° close to 90°. On the contrary, in a comparative example using an etching gas that is a gaseous mixture of $H_2$/Ar/CO, the sidewall is etched in a tapered shape such that an angle between the sidewall and the horizontal plane (an included angle with respect to the horizontal plane) becomes about 80°, as shown in FIG. 3B.

It is considered that the etching mechanism of the Pt—Mn layer is mainly based on the following chemical reaction. That is, a carbon deposition layer generated from carbon dioxide or the like is deposited on a surface of the Pt—Mn layer and then ashed by a hydrogen plasma that has been excited by collision with an argon plasma. Further, positive ions of the argon plasma are incident on the carbon deposition layer, thereby supplying energy to the carbon deposition layer. The carbon deposition layer to which the energy is supplied combines with oxygen from carbon dioxide, thereby generating a carbonyl group. The generated carbonyl group combines with hydrogen, so that a carboxyl group (—COON) is generated. The carboxyl group as a ligand is coordinate-bonded with Pt of the Pt—Mn layer, thereby generating an organic complex, e.g., $Pt(COOH)_n$. Since Pt of the Pt—Mn layer is used for generation of the organic complex, a part of the Pt—Mn layer is modified to the organic complex. Generally, an organic complex of a metal has a low saturated vapor pressure, so that the organic complex is easily vaporized. As a result, a part of the Pt—Mn layer is etched.

Figure 4:
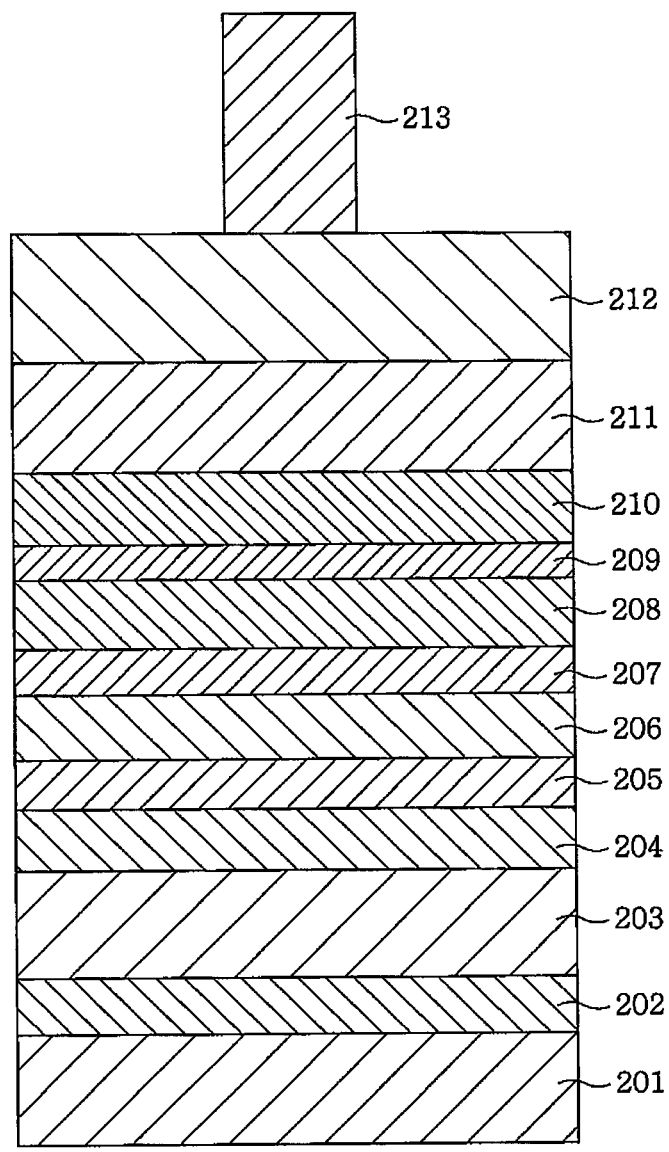
FIG. 4 schematically shows a structure of a semiconductor wafer to which the present invention can be applied.

FIG. 4 schematically shows a structure of another semiconductor wafer W to which the dry etching method for a metal film in accordance with the present embodiment can be applied. In this semiconductor wafer W, a Ta layer 202, a Pt—Mn layer 203, a CoFe layer 204, a Ru layer 205, a CoFeB layer 206, a MgO layer 207, a CoFeB layer 208, a Ta layer 209, a Ru layer 210, a Ta layer 211, a SiN layer 212 and a SiO layer 213 patterned in a predetermined shape are formed in that order from the bottom on an oxide layer 201 formed on a silicon substrate. The dry etching method for a metal layer of the present invention is preferably applied to dry etching of the Pt—Mn layer 203 of the semiconductor wafer W having the above lamination structure.

In accordance with the present invention, there is provided a dry etching method for a metal film capable of making a vertical sidewall of a hole or trench more vertical without using a halogen gas.

Although the embodiment of the present invention has been described, the present invention may be variously modified without being limited to the above embodiment. For example, in the above embodiment and test example, the case in which the Pt—Mn layer is subjected to dry etching has been described. However, the present invention may also be applied to a case in which a Pt layer containing only Pt or a layer containing Pt and anther metal is subjected to dry etching. Moreover, a gas system used in the above embodiment and text example can be used for dry etching of a magnetic material such as CoFeB.

While the invention has been shown and described with respect to the embodiments, it will be understood by those skilled in the art that various changes and modifications may be made without departing from the scope of the invention as defined in the following claims.

What is claimed is:

1. A method for performing dry etching on a metal film containing Pt via a mask layer, comprising:
performing dry etching on the metal film by generating a plasma of an etching gas including a gaseous mixture consisting essentially of $H_2$ gas, $CO_2$ gas, methane gas and a rare gas,
wherein the etching gas contains neither a halogen gas nor CO gas.

2. The method of claim 1, wherein the metal film includes Pt and Mn.

3. The method of claim 2, wherein the performing dry etching includes generating at least one of a carbonyl group, a carboxyl group or an organic complex.

4. The method of claim 1, wherein the rare gas is Ar gas.

5. The method of claim 1, wherein the mask layer is made of tantalum.

6. The method of claim 1, wherein the dry etching is performed on the metal film in an atmosphere in which a pressure ranges from about 6.65 Pa to 133 Pa.

7. The method of claim 6, wherein the dry etching is performed on the metal film in an atmosphere in which the pressure ranges from about 13.3 Pa to 133 Pa.

8. The method of claim 1, wherein the dry etching is performed by generating a plasma of an etching gas consisting of a gaseous mixture of $H_2$ gas, $CO_2$, gas, methane gas and a rare gas.

9. The method of claim 1, wherein the metal film comprises Pt, and wherein during performing the dry etching an organic complex is generated that includes Pt of the metal film, and wherein the organic complex is vaporized during etching.

10. The method of claim 9, wherein performing the dry etching further includes generating a carboxyl group which is bonded with Pt of the metal film to form the organic complex.

11. The method of claim 10, wherein performing the dry etching includes generating a carbonyl group, and wherein the carbonyl group combines with hydrogen to form the carboxyl group.

* * * * *